US009921683B2

United States Patent
Cooley et al.

(10) Patent No.: US 9,921,683 B2
(45) Date of Patent: Mar. 20, 2018

(54) DETECTION OF DEFECTS IN TOUCH SENSORS

(75) Inventors: Daniel J. Cooley, Austin, TX (US);
Jeffrey L. Sonntag, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 178 days.

(21) Appl. No.: 13/483,465

(22) Filed: May 30, 2012

(65) Prior Publication Data

US 2013/0321010 A1    Dec. 5, 2013

(51) Int. Cl.
*G01R 31/02*    (2006.01)
*G06F 3/045*    (2006.01)
*G06F 3/041*    (2006.01)

(52) U.S. Cl.
CPC .......... *G06F 3/0418* (2013.01); *G01R 31/025* (2013.01)

(58) Field of Classification Search
CPC .............................. G06F 3/0418; G01R 31/025
USPC ............. 324/750.01, 543, 537, 548; 345/174
See application file for complete search history.

(56) References Cited

U.S. PATENT DOCUMENTS

| 5,089,783 A * | 2/1992 | Kapsokavathis .. G01N 33/2852 324/672 |
| 5,804,960 A * | 9/1998 | El Ayat .......... G01R 31/318516 324/73.1 |
| 7,932,898 B2 | 4/2011 | Philipp et al. |
| 2008/0111714 A1* | 5/2008 | Kremin .................... G06F 3/044 341/33 |
| 2011/0068848 A1* | 3/2011 | Chuang et al. ............... 327/345 |
| 2012/0229417 A1* | 9/2012 | Badaye ......................... 345/174 |
| 2012/0268413 A1* | 10/2012 | Narasimhan .......... G06F 3/0418 345/174 |
| 2012/0293455 A1* | 11/2012 | Shen et al. ..................... 345/174 |

\* cited by examiner

Primary Examiner — Farhana Hoque
(74) Attorney, Agent, or Firm — Zagorin Cave LLP (57) ABSTRACT

Defects in a touch sensor are detected by coupling the sensor lines to a common signal line. Each of the sensor lines is tested by disconnecting the sensor line from the common signal line, connecting it to a voltage (e.g., ground) and comparing the voltage on the common signal line to a reference voltage. Detected defects include a short circuit between any two transmit and/or receive lines and a short between any transmit or receive line to ground.

19 Claims, 12 Drawing Sheets

DETECTION OF DEFECTS IN TOUCH SENSORS

BACKGROUND

Field of the Invention

This invention relates to touch sensors and more particularly to detecting defects in touch sensors.

Description of the Related Art

Figures 1A, 1B:
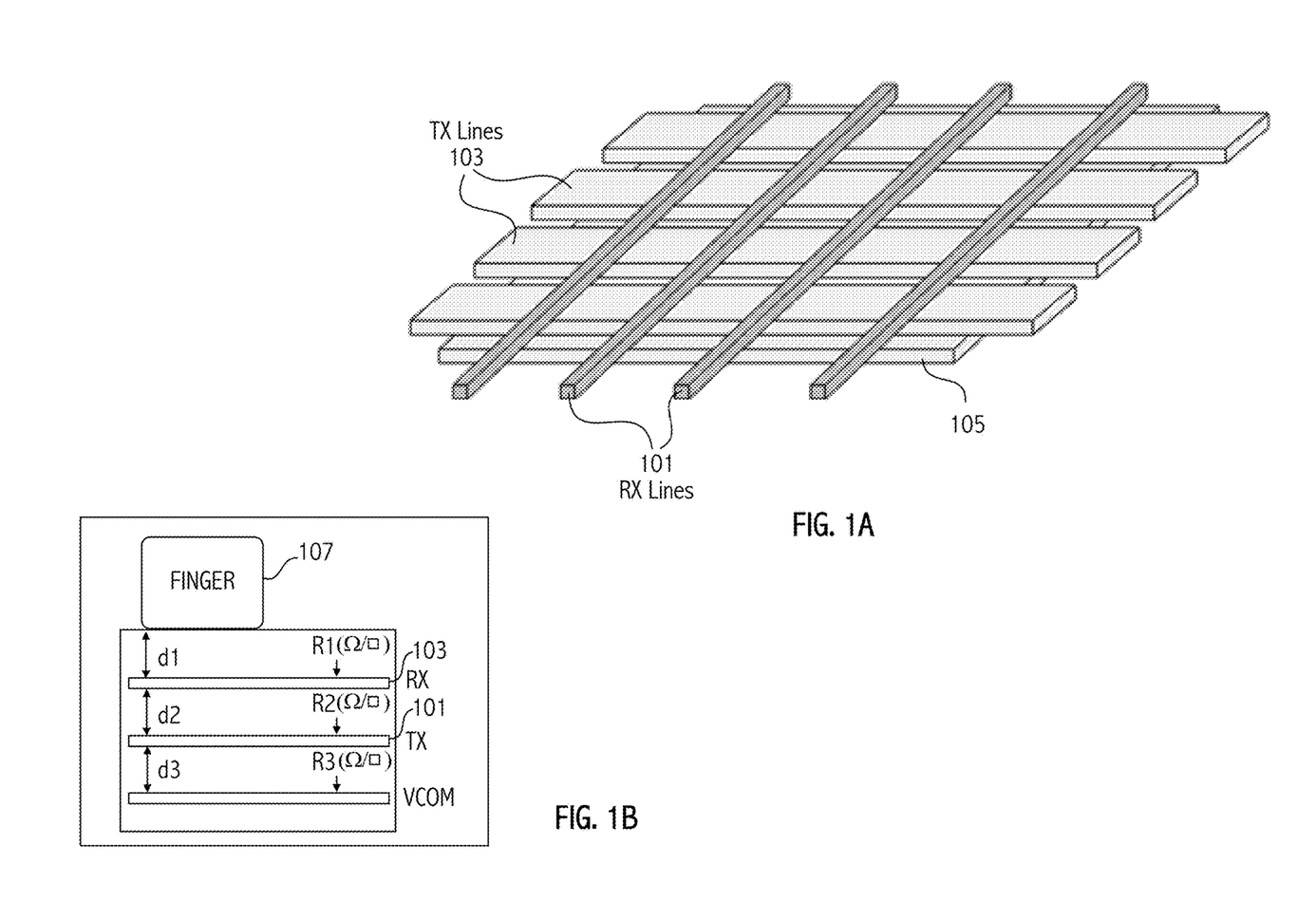
FIG. 1A illustrates a two-layer touch sensor.
FIG. 1B illustrates another view of the two-layer sensor.

Touch sensors are used in handsets, tablets, and other electronic devices that utilize human touch. Touch sensors are typically composed of one or more layers of clear, conductive traces deposited onto glass or plastic substrates. Indium-tin-oxide (ITO) is commonly used for the traces. FIG. 1A illustrates an exemplary two-layer touch sensor. In FIG. 1A the ITO conductive traces include receive lines 101 and transmit lines 103. The conductive traces are typically utilized with a liquid crystal display (LCD) 105. Another view of a two-layer conductive trace is shown in FIG. 1B, showing a finger 107 that touches the touch sensor and the distances d1, d2, and d3 between the various layers. VCOM shown in FIG. 1B is the common electrode of the LCD module.

Figure 2A:
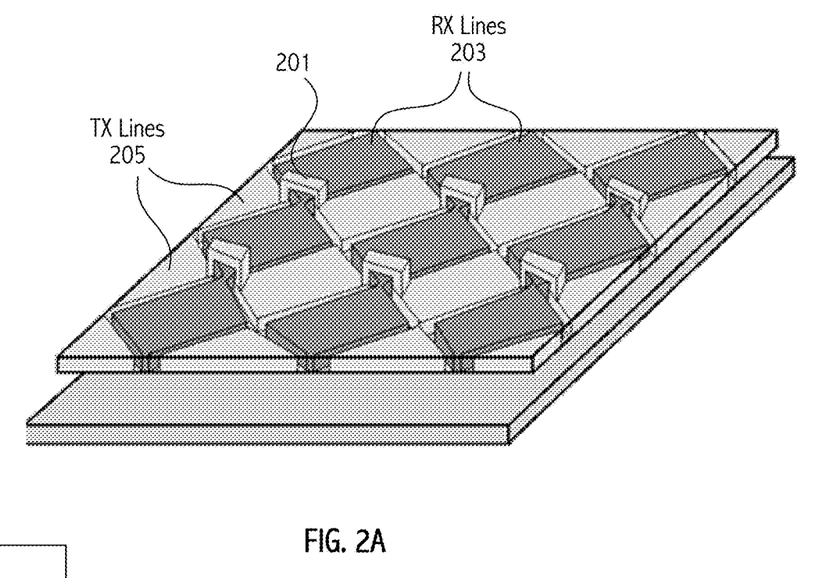
FIG. 2A illustrates a one-layer touch sensor.
Figure 2B:
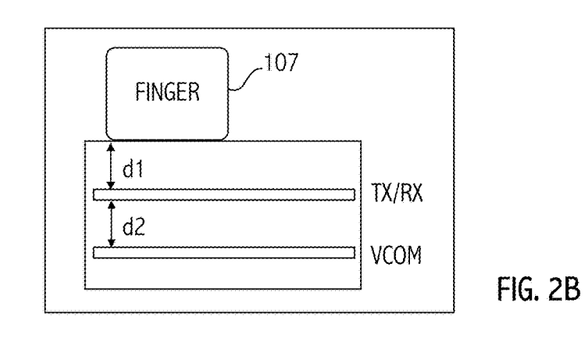
FIG. 2B illustrates another view of the one-layer sensor.

A single-layer touch sensor is shown in FIG. 2A where ITO bridges 201 connect transmit lines 205 over the receive lines 203. Another view of the single-layer touch sensor is shown in FIG. 2B showing the distances d1 and d2 between the various layers.

Touch sensors are expensive to produce. The manufacturing steps for making the touch sensors are numerous and error-prone, resulting in the potential for manufacturing defects. Improvements in detecting such manufacturing defects can reduce manufacturing costs and increase product quality.

SUMMARY OF EMBODIMENTS OF THE INVENTION

Accordingly, one benefit of one or more embodiments of the invention is to detect defects in a touch sensor before assembly. Such defects include a short circuit between any two transmit and receive lines and a short between any transmit or receive line to ground.

One embodiment provides a method of detecting defects associated with sensor lines in a touch sensor. The method includes coupling a plurality of sensor lines to a common signal line. A first voltage is coupled to a first sensor line that is disconnected from the common signal line. A voltage present on the common signal line is compared to a reference voltage to indicate whether a defect exists that is associated with the first sensor line.

In another embodiment, an apparatus is provided that includes a plurality of sensor lines in a touch panel. A first plurality of switches selectively couple the sensor lines to a common signal line and a second plurality of switches selectively couple the sensor lines to a first voltage. Compare logic compares a voltage on the common signal line to a reference voltage, and a value of an output of the compare logic indicates whether a defect exists in one of the sensor lines.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 3:
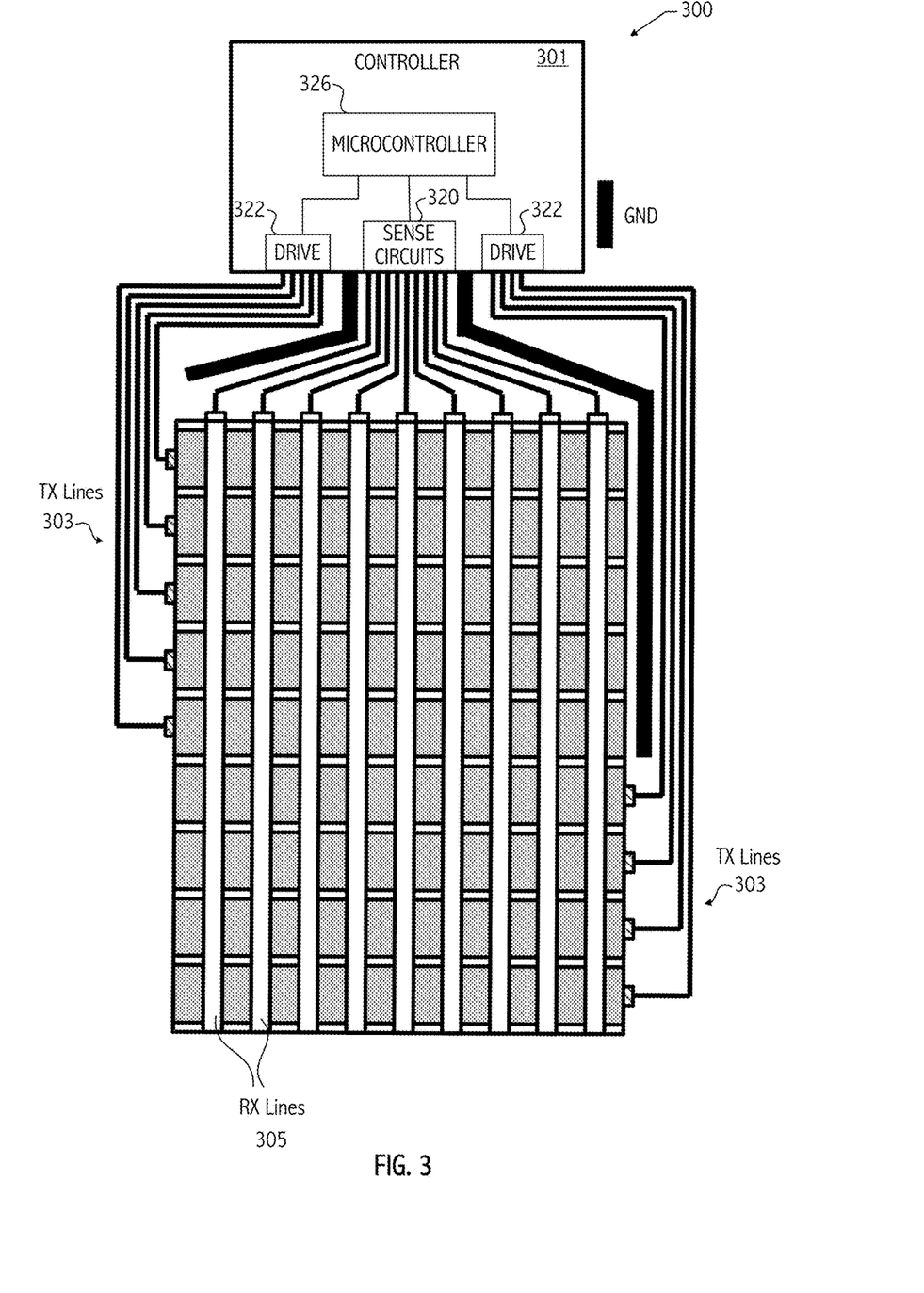
FIG. 3 illustrates an embodiment of the invention with no defects.

Referring to FIG. 3, illustrated is an exemplary touch screen system 300 including a controller 301, and transmit (TX) lines 303 and receive (RX) lines 305. The controller 301 supplies signals to the receive lines 305 and receives signals from the transmit lines 303 that vary according to a touch on the touch screen. The touch screen operates conventionally as a capacitive touch screen. The controller 301 includes sense circuits 320 to measure signals associated with RX lines that vary with touch. The controller further includes drive circuits 320 to drive the TX lines with appropriate signals. The drive circuits, sense circuits, and control functionality associated therewith are known in the art. The control functionality may be provided by an integrated circuit including a microcontroller 326 or other suitable control functionality such as a field programmable gate array (FPGA) or application specific integrated circuit (ASIC). The microcontroller or processor or other control circuitry may be implemented on the same die as the sense and drive circuits. The software to implement the functionality associated with detecting manufacturing defects on the touch screen may be stored in computer readable storage media (not separately shown) that may include RAM, ROM, One Time Programmable (OTP) memory, EEPROM, or other storage media or a combination of any of the preceding. In other embodiments, the controller may be implemented as hardwired logic, or in a Field Programmable Gate Array (FPGA), or in some other computer resource off-chip. The system 300 illustrates a touch system without any faults.

Figure 4:
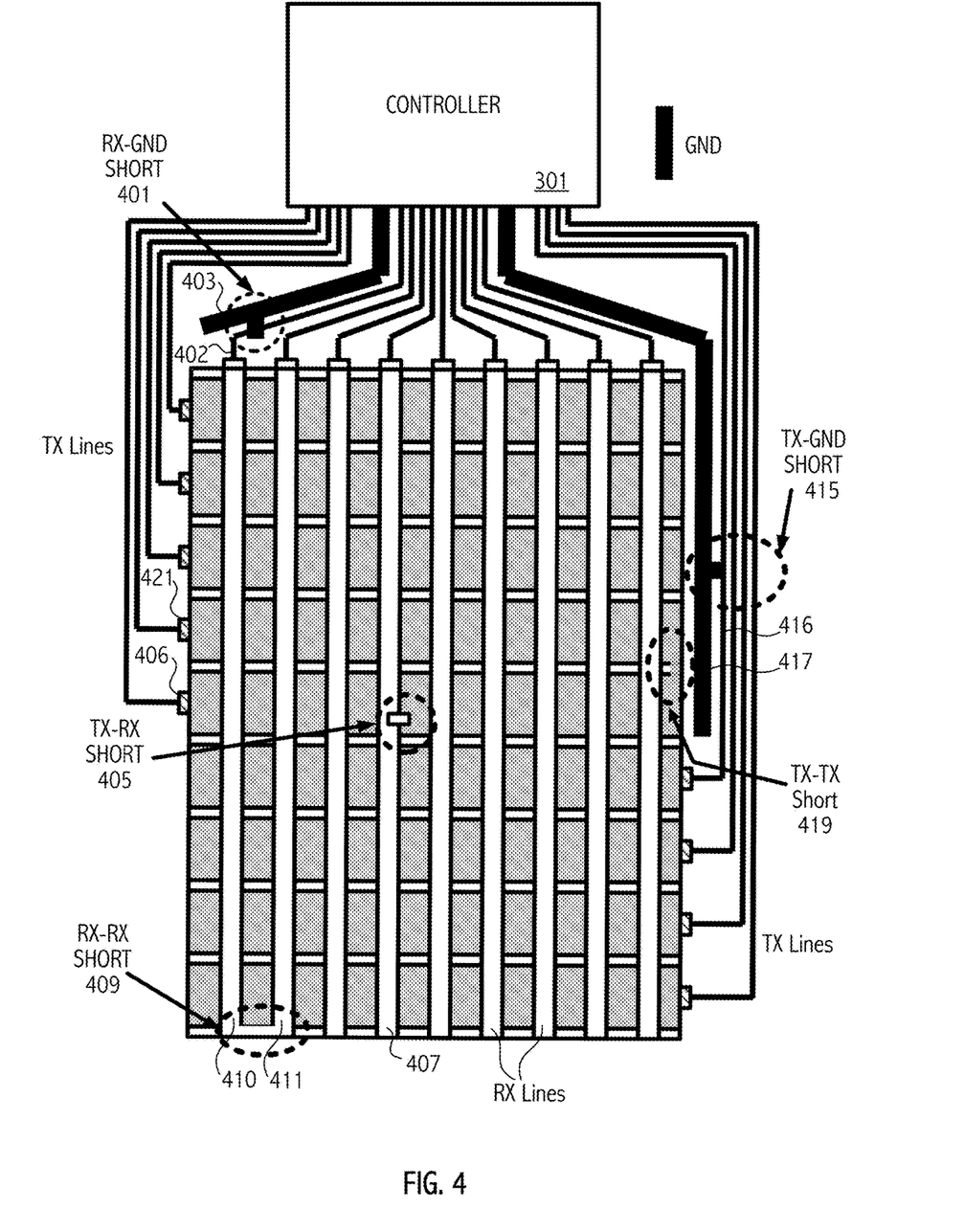
FIG. 4 illustrates an embodiment of the invention with various shorts that may be detected utilizing teachings herein.

Referring to FIG. 4, illustrated are various manufacturing defects that may be associated with the manufacture of the touch screen. At 401 an RX line 402 is shown as shorted to ground 403. At 405 a TX-RX short exists with transmit line 406 being shorted to receive line 407. At 409 an RX-RX short exists between receive lines 410 and 411. At 415, a TX line 416 is shorted to ground 417. At 419 TX line 406 is shorted to TX line 421. When any of the illustrated types of shorts occur, the panel is defective.

If the ITO traces are shorted as shown in FIG. 4, the controller 301 should be able to detect the existence of the short by testing the sensor connections to terminals (also referred to herein as pins) of the integrated circuit to which the sensor lines are connected. One approach to accomplish detection of the shorts is to look for two classes of shorts. The first is pin-to-pin shorts, which include TX-TX, TX-RX, and RX-RX. The second class of shorts is pin-to-ground which includes TX-GND and RX-GND. The ITO shorts can show up as low-resistance (short to ground) or high-resistance (pin to pin) shorts from the controller's perspective.

The sheet resistance of the TX or RX line can be large, e.g., hundreds of ohms per square ($\Omega/\square$), where a square is length/width of the trace. For example, the ITO sheet resistance can be 300-400 ohms/square ($\Omega/\square$). The RX lines are typically thin (e.g., 0.5 mm) and long (e.g., 100 mm). If two RX lines are shorted together at a maximum distance from the controller, such as defect 409, the resistance of the line doubles. For example, assuming a sheet resistance of $330\Omega/\square$, and a width of 0.5 mm, Rtotal=$(330\Omega/\square) \times (200\square) \times (2) = 140$ k$\Omega$.

Figure 5:
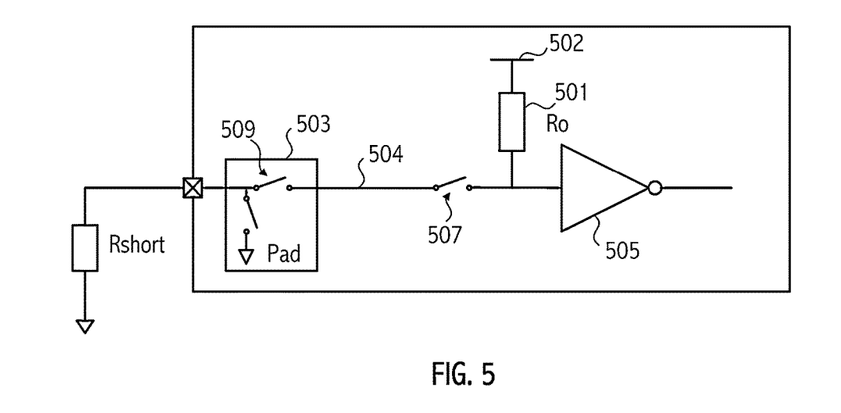
FIG. 5 illustrates a simple test architecture.

FIG. 5 illustrates a simple architecture that may be used to detect the shorts illustrated in FIG. 4. The architecture includes a pull-up resistor (Ro) 501 between a supply voltage 502 and a signal line that connects to a pad area 503 of the controller, which in turn is connected to one of the TX or RX lines. During the test, switches 507 and 509 are closed. If the TX or RX line is not shorted to ground, the input to the inverter will be the voltage present on the signal line 504 due to the pull-up resistor 501, and the output of the inverter 505 will be low. If, on the other hand, the TX or RX line is shorted to ground or close to ground (resistance of resistor 501>>resistance of Rshort 511), the inverter output will be high. While the architecture of FIG. 5 has the advantage of being simple, it also has some drawbacks. The architecture requires a large resistance (in M$\Omega$'s) for resistor 501. The determination of existence of the short is not very precise. There is not much adjustability in operation and the inverter and resistor are sensitive to process, voltage, and temperature (PVT) variations.

Figure 6:
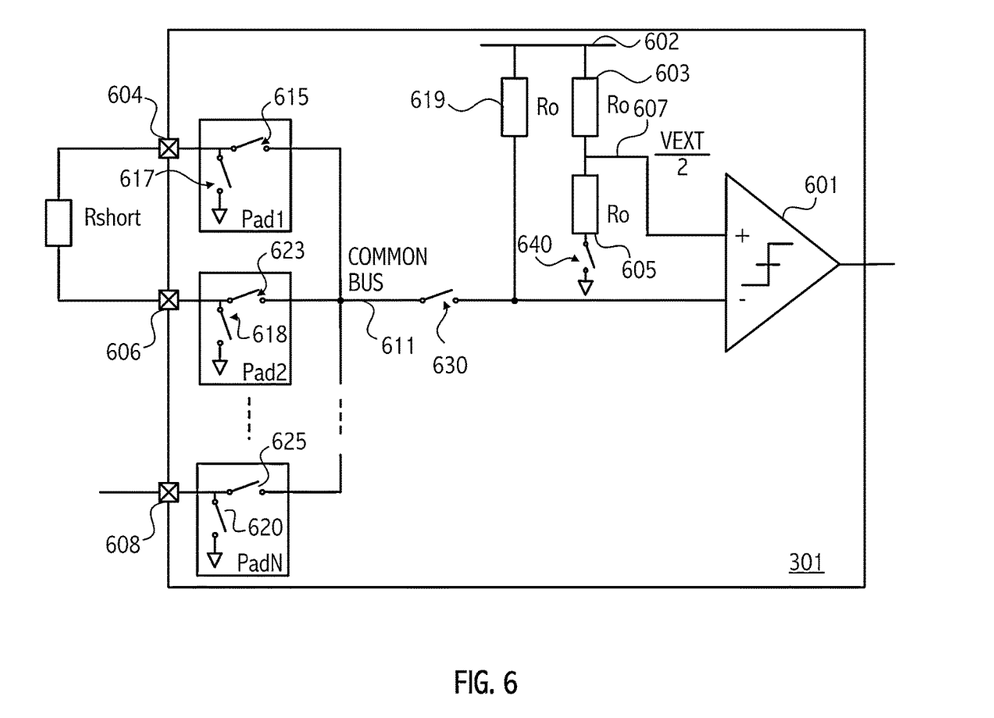
FIG. 6 illustrates a test architecture according to an embodiment of the invention.

FIG. 6 illustrates another embodiment that is more robust and provides more programmability and precision. The embodiment of FIG. 6 utilizes a comparator 601 instead of an inverter to compare a voltage present on a signal line 611 (also referred to herein as common bus) to a reference voltage on node 607 to determine if there is a manufacturing defect. In the embodiment of FIG. 6, a voltage divider is formed by resistors 603 and 605, which divide the voltage (VEXT) on 602 to provide the reference voltage to the positive input of the comparator on node 607. If the resistors 603 and 605 are nominally equal, the reference voltage on node 607 is approximately (VEXT/2). VEXT may be an external voltage as suggested by its name or a voltage from within the integrated circuit may be used. All of the pins 604, 606, 608 that are coupled to TX or RX lines connect inside of the controller 301 to a common bus 611. To determine the presence of TX-TX, TX-RX, or RX-RX shorts, one-by-one, a single pin is disconnected from the common bus 611 via a switch 615, 623, or 625, and then is grounded internally through another switch 617, 618, or 620, according to which pin is being tested. A pull-up resistor 619 pulls up the common bus 611 to the voltage VEXT. If the comparator supplies a zero output (negative input of comparator 601 is larger than positive input), that indicates no short exists. If the comparator output is high (logical one), that signals the existence of a short. If any shorts are detected, the touch panel should be rejected. Note that the embodiment shown in FIG. 6 can be implemented on the controller 301. The TX and RX lines are coupled to the appropriate drive or sense circuits (not shown in FIG. 6 for ease of illustration) through the pins 604, 606, and 608 (see the drive and sense circuits in FIG. 3).

Figure 7:
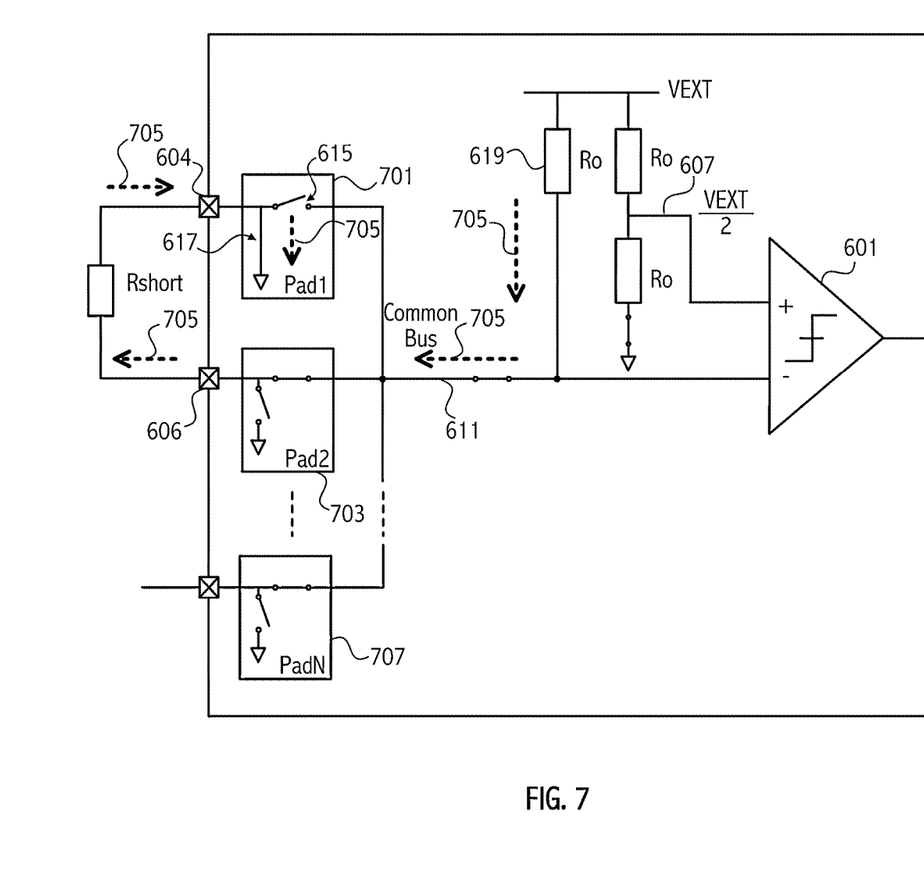
FIG. 7 illustrates how the architecture of FIG. 6 detects a defect when the TX and/or RX lines are shorted together.
Figure 8:
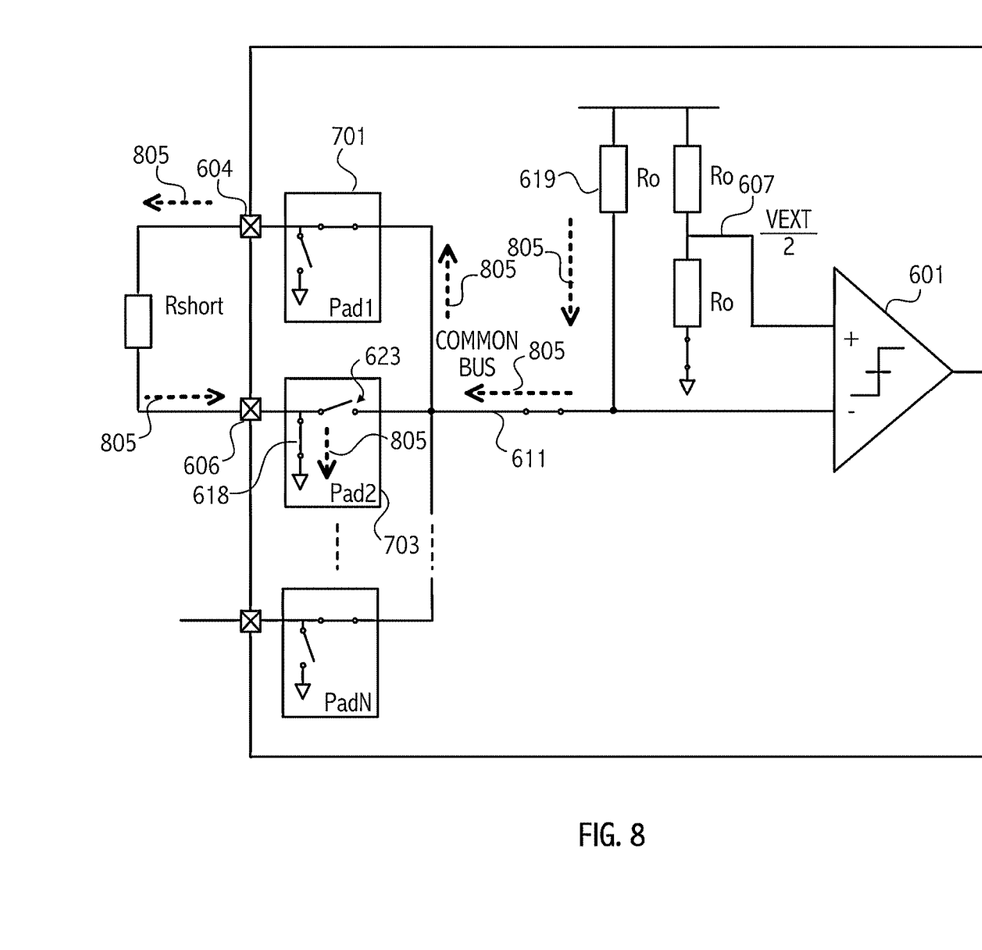
FIG. 8 illustrates another testing configuration of the common bus.
Figure 9:
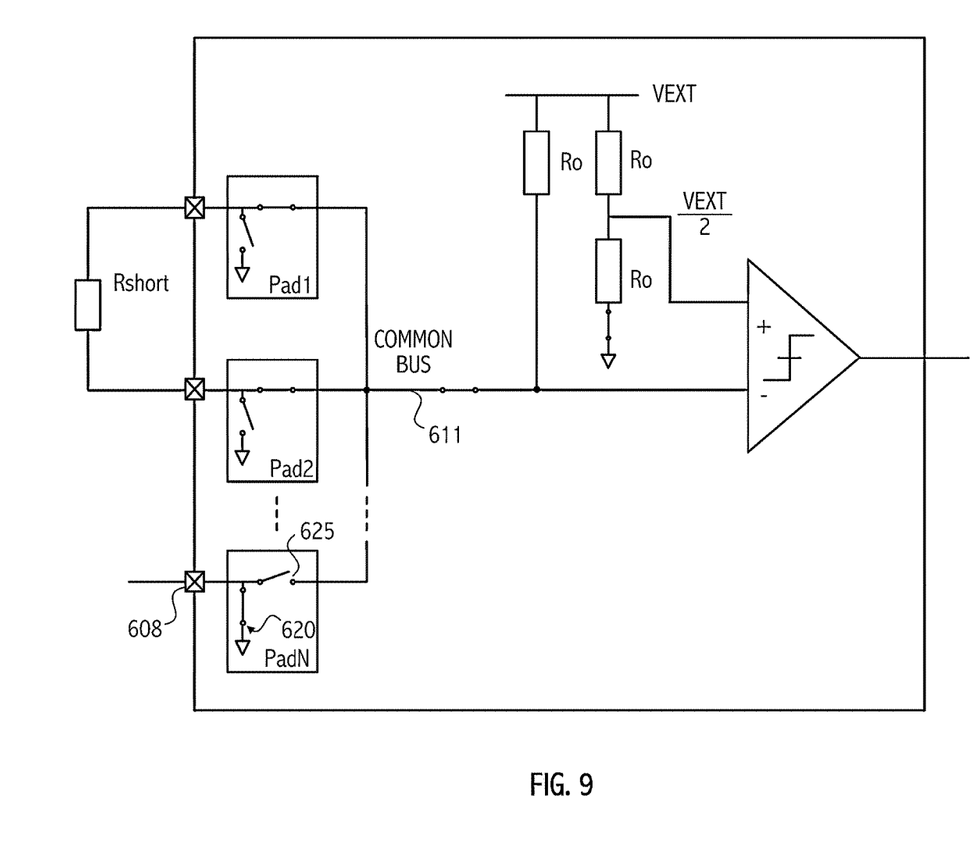
FIG. 9 illustrates operation of the architecture when there is no defect associated with a TX or RX line connected to a pad.

FIGS. 7-9 illustrate operation of the architecture of FIG. 6. FIG. 7 detects the defect when the TX or RX lines coupled to pins 604 and 606 are shorted together. In an exemplary operation, first, pin 604 in pad region 701 (Pad1) is disconnected from the common bus 611 by opening switch 615. Pin 604 is grounded internally through switch 617. Assuming a pin-to-pin short exists between pins 604 and 606, meaning a TX or RX line is shorted to another TX or RX line, current 705 will flow through pull-up resistor 619, through the common bus 611, to Pad2 703, through the TX or RX lines and the short (Rshort) between them, through Pad1 701 to GND. As a result, the negative input of comparator 601 will be pulled towards ground. The reference voltage on node 607 supplied to the positive input of comparator 601 will be higher than the negative input resulting in the comparator supplying an output that is high, indicating a short. Note that if a short exists between the TX or RX lines coupled to pin 604 and any of the other TX or RX lines, the current will flow through the pad that is connected to the other TX or RX line, through the short and then to the ground connection in pad region 701, resulting in the negative input of the comparator being pulled towards ground and the comparator indicating a short.

FIG. 8 illustrates a second configuration of the common bus for testing. During testing, the control logic, such as microcontroller 326, or a state machine, sequentially configures the common bus for testing by appropriately causing the switches to be opened and closed for the particular configuration being tested. In the particular configuration of FIG. 8, Pad2 703 is disconnected from the common bus 611 by opening switch 623. Pin 606 is grounded internally through switch 618. If a short exists between pins 604 and 606, current 805 flows through pull-up resistor 619, through the common bus 611 to Pad1 701 through the TX or RX lines and the short (Rshort) between them, through Pad2 703 to GND. As a result the negative input of comparator 601 will be pulled towards ground. The reference voltage on node 607 supplied to the positive input of comparator 601 will be higher than the negative input resulting in the comparator supplying an output that is high, indicating a short. Note that if a short exists with any of the other TX or RX lines and pin 606, the current will flow through that TX or RX line to the ground connection in Pad2, resulting in the negative input of the comparator being pulled towards ground and the comparator 601 indicating a short.

This process is repeated for each of the TX and RX lines. FIG. 9 illustrates operation of the architecture when there is no defect associated with a TX or RX line connected to a pin being tested. In this case, pin 608 is disconnected from the common bus by opening switch 625. Pin 608 is grounded by closing switch 620. Because the TX or RX line connected to pin 608 is not shorted to any other TX or RX line, and is disconnected from the common bus 611, no current flows and the common bus 611 sits at the voltage VEXT. As a result, the negative input to the comparator is pulled up to VEXT, the positive input is VEXT/2 and the comparator output is low, indicating no short. By testing each of the TX and RX lines, the particular RX or TX lines that are shorted can be identified.

Figure 10:
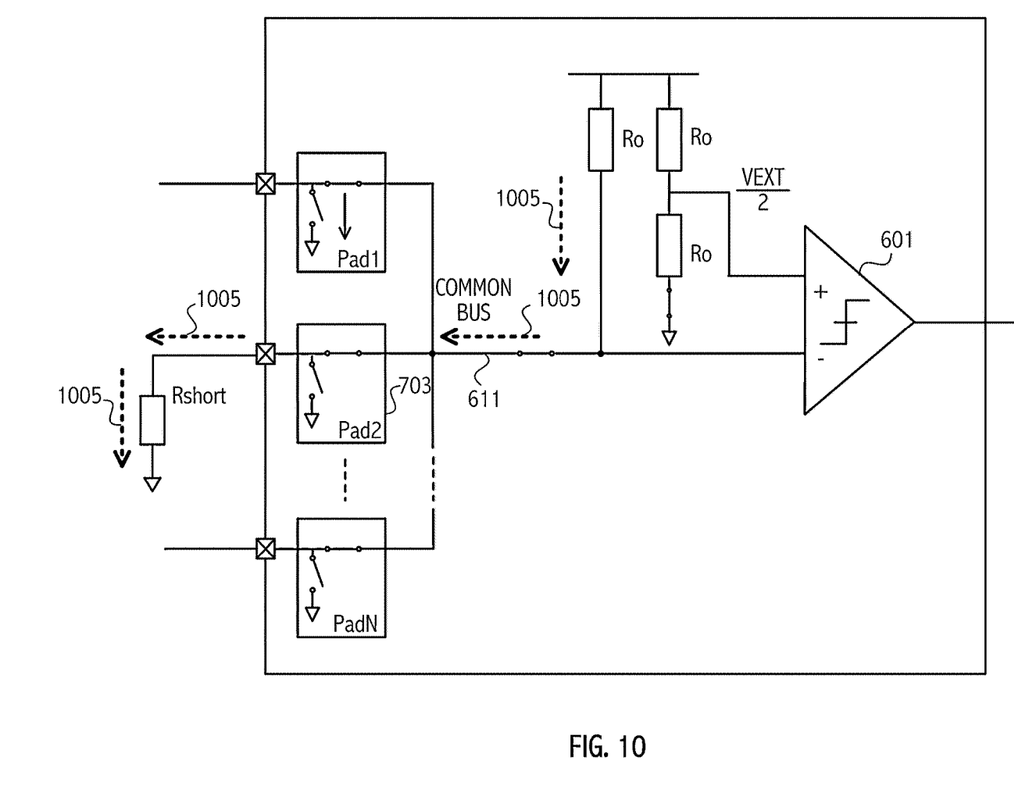
FIG. 10 illustrates an embodiment for simultaneously testing whether any of the TX or RX lines have a ground short.

FIG. 7 through FIG. 9 illustrate testing of shorts between TX-TX, TX-RX, and RX-RX lines. FIG. 10 illustrates an embodiment for testing whether any of the TX or RX lines has a short to ground. In the embodiment of FIG. 10, each pin is connected to the common bus 611. If any of the pins are connected to a short to ground through one of the TX or RX lines, e.g., as shown for Pad2 703, the current 1005 will flow as shown causing the negative input of the comparator 601 to be pulled towards ground resulting in the comparator output being high, thereby indicating a short. The approach of testing all the TX and RX lines at the same time for a short to ground has the advantage of quickly testing for any shorts to ground, but has the disadvantage of not being able to identify the location of the short.

Figure 11:
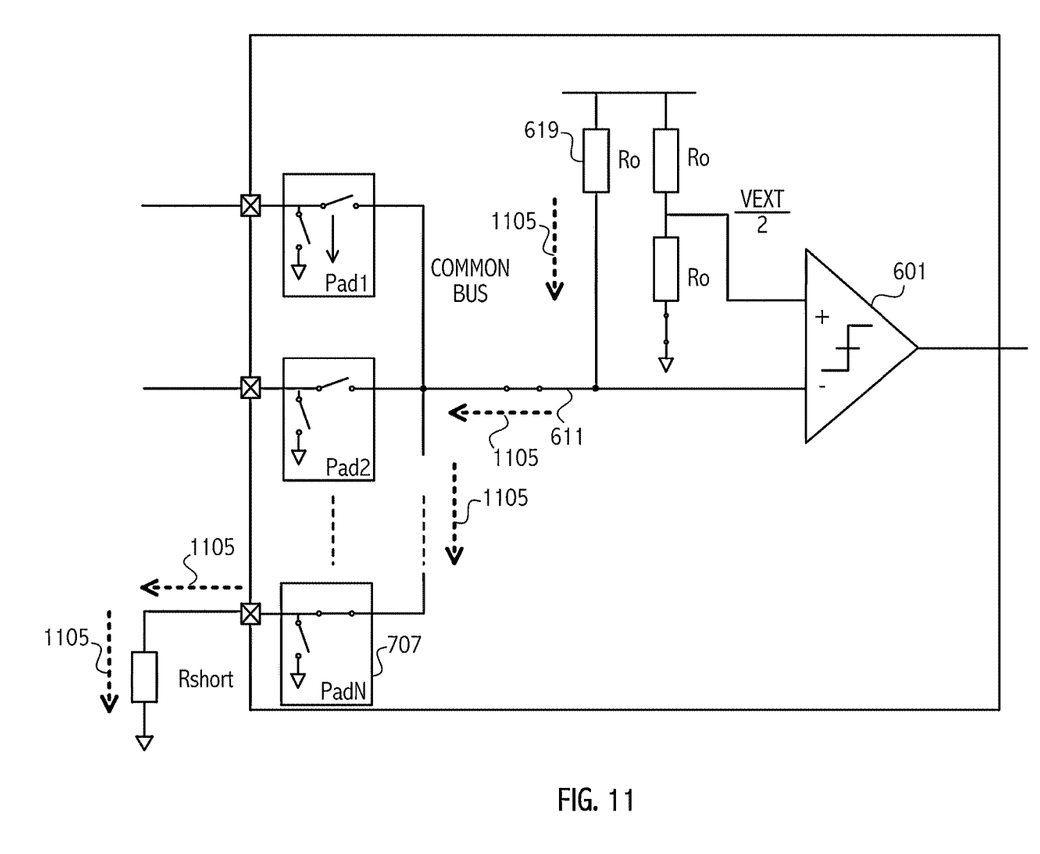
FIG. 11 illustrates an approach where each TX and RX line is tested one at a time for a short to ground.

After testing all the TX and RX lines for a short to ground simultaneously, or instead of that testing, each TX or RX line may be tested one at a time. FIG. 11 illustrates such an approach where each TX and RX line is tested one at a time. Each pin is connected one-by-one to the common bus 611. If the comparator output is zero, there is no short, but a comparator output of a one indicates a short. In FIG. 11, the TX or RX line connected to PadN is being tested for a short and the current 1105 flows through the pull-up resistor 619, through PadN 707 and through the short to ground. Using the approach of FIG. 11, the particular RX or TX line associated with the short to ground can be identified. In the example of FIG. 11, pin 608 will be identified as having a short to ground.

One way to view the testing is that it determines a resistance of the TX or RX line being tested. Assuming, e.g., an ITO sheet resistance to be 330Ω/□, an RX line can be 100 mm long and 0.5 mm wide, or 200□. If the short to another TX or RX line occurs at the far end, with respect to the controller, that would be 400□, which is 132 kΩ. Under those conditions, if the resistance between any two pins is ≤132 kΩ, with the tests described in FIGS. 7-9, the touch panel should be rejected.

In operation, the common bus is configured for testing the various RX and TX lines as described e.g., in FIGS. 6-11. Each configuration requires switches to be set appropriate for the test to be run. As the switches may be implemented as transistors, the control signal to open or close the switch can be provided quickly and easily from the controller. As compared to other test approaches, which can take more than a second to complete, the approach described herein can test the touch panel in less than 10 ms.

Figure 12:
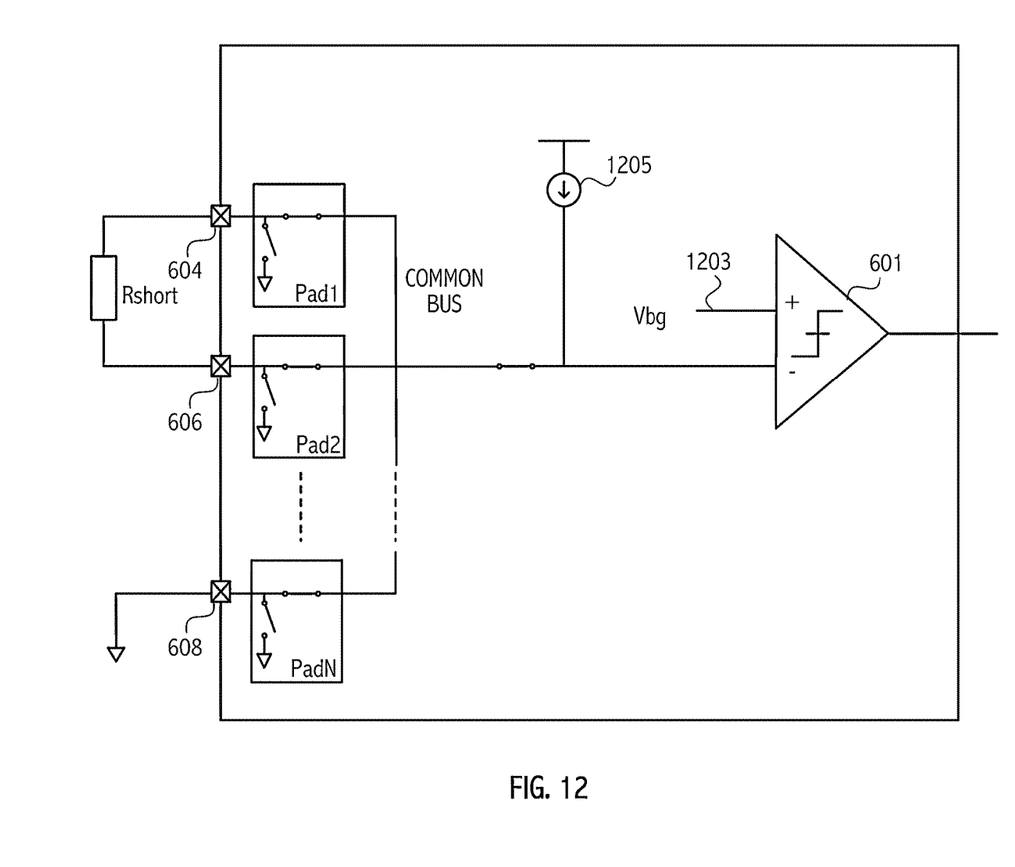
FIG. 12 illustrates an embodiment where a current source and bandgap voltage are utilized in place of a pull-up resistor and voltage divider.

FIG. 12 illustrates another embodiment of the invention where the signals supplied to the comparator 601 differ from the embodiment of FIG. 6. In particular, rather than using a voltage divider to supply the reference voltage to the positive input of comparator 601, a band-gap voltage (Vbg) 1203 generated in controller 301 is supplied to the positive input. In addition, in the embodiment of FIG. 12, an adjustable current source 1205 is used in place of the pull-up resistor 619 shown in other embodiments.

Figure 13:
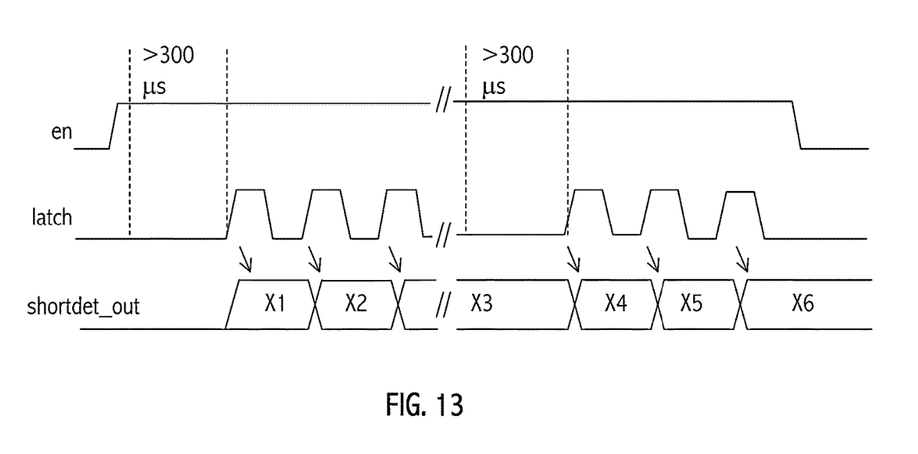
FIG. 13 illustrates a timing diagram associated with an embodiment of the invention.
Figure 14:
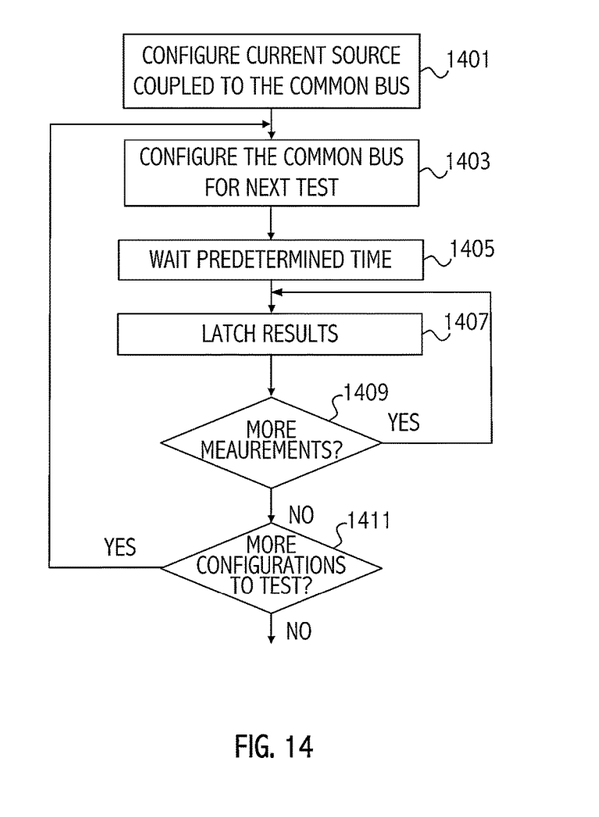
FIG. 14 illustrates a flow diagram associated with the timing diagram of FIG. 13.

FIG. 13 shows a timing diagram illustrating operation of the testing for manufacturing defects according to an embodiment. In the embodiment illustrated in FIG. 13, there are three main signals. The first signal is the block enable (en) (0=OFF, 1=ON). The block enable signal powers on the block. A second signal is a latch signal which indicates when to latch the output of the comparator. In an exemplary embodiment, the latch signal indicates to latch the output on the rising edge. The third signal is shortdet_out, which is the output of the comparator (0=no short, 1=short). FIG. 14 illustrates a flow diagram of an embodiment of the testing operation. In 1401 the adjustable current source 1205 is configured as desired. In 1403 the common bus is configured with the pad configuration to be tested by opening and closing appropriate switches. In 1405 the test control logic waits for a predetermined amount of time, e.g., at least 300 is as shown in FIG. 13, to allow for RC settling transients. The wait allows the system to settle before making a decision on whether or not shorts are present. In 1407 the results are stored by raising the latch signal. Multiple measurements may be desired for any particular configuration. Thus, if more measurements are desired in 1409, the measurements are repeated by latching in additional results in 1407. More measurements may provide greater confidence as to the existence or lack of existence of a short. When no more measurements for a particular test configuration are desired, step 1411 determines if additional configurations should be tested. If yes, the flow returns to configure the common bus for the next test at 1403 by configuring the switches appropriately and the steps 1405 through 1409 are repeated for that configuration.

The configuration of the various switches shown, e.g., in FIGS. 6-12, may be done under control of a microcontroller in the control logic or other control logic. The overall test flow of FIG. 14 may be accomplished utilizing that microcontroller or other control functionality, such as state machines, as is appropriate for any particular embodiment.

The description of the invention set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. A method of detecting defects associated with sensor lines in a touch sensor comprising:
controlling one of a first plurality of switches to couple a first sensor line of a plurality of sensor lines to a first voltage;
controlling a second plurality of switches to simultaneously couple other sensor lines of the plurality of sensor lines to a common signal line; and
while the other sensor lines are simultaneously coupled to the common signal line and the first sensor line is coupled to the first voltage and is disconnected from the common signal line, comparing a voltage present on the common signal line to a reference voltage to determine if a defect exists that is associated with the first sensor line.

2. A method of detecting defects associated with sensor lines in a touch sensor comprising:
simultaneously coupling a plurality of sensor lines to a common signal line; and
while the plurality of sensor lines are simultaneously coupled to the common signal line:
coupling a first voltage to a first sensor line that is disconnected from the common signal line; and
comparing a voltage present on the common signal line to a reference voltage to determine if a defect exists that is associated with the first sensor line;
decoupling the first sensor line from the first voltage;
coupling the first sensor line to the common signal line;
disconnecting a second sensor line from the common signal line, a second plurality of sensor lines being simultaneously coupled to the common signal line; and while the second plurality of sensor lines are simultaneously coupled to the common signal line: coupling the disconnected second sensor line to the first voltage; and comparing the voltage present on the common signal line to the reference voltage to determine if a defect exists that is associated with the disconnected second sensor line.

3. The method as recited in claim 2 wherein the plurality of sensor lines includes transmit lines and receive lines of a touch sensor.

4. The method as recited in claim 1 further comprising supplying as the reference voltage a bandgap voltage reference.

5. The method as recited in claim 1 further comprising supplying a second voltage to the common signal line.

6. The method as recited in claim 5 further comprising supplying as the reference voltage a voltage value that is less than the second voltage.

7. The method as recited in claim 6 wherein the reference voltage is approximately half the second voltage.

8. The method as recited in claim 1 wherein the first voltage is ground.

9. The method as recited in claim 8 further comprising determining the defect exists in response to the voltage present on the common signal line being lower than the reference voltage.

10. The method as recited in claim 1 wherein the plurality of sensor lines includes transmit lines and receive lines of the touch sensor.

11. An apparatus comprising:
a plurality of sensor lines in a touch panel;
a first plurality of switches to selectively couple the plurality of sensor lines to a common signal line;
a second plurality of switches to selectively couple the plurality of sensor lines to a first voltage;
control logic configured to couple a first sensor line of the plurality of sensor lines to the first voltage through one of the second plurality of switches and configured to simultaneously couple other sensor lines of the plurality of sensor lines to the common signal line through corresponding switches of the first plurality of switches; and compare logic to compare a voltage on the common signal line to a reference voltage while the first sensor line is coupled to the first voltage and the other sensor lines are simultaneously coupled to the common signal line, wherein a value of an output of the compare logic indicates whether a defect exists in the first sensor line.

12. The apparatus as recited in claim 11 wherein the control logic is further configured to cause an output of the compare logic to be stored.

13. The apparatus as recited in claim 11 wherein the control logic is further configured to:
decouple the first sensor line from the first voltage;
couple the first sensor line to the common signal line;
decouple a second sensor line of the plurality of sensor lines from the common signal line while others of the plurality of sensor lines remain coupled to the common signal line; and
couple the second sensor line to the first voltage.

14. The apparatus as recited in claim 11 wherein the reference voltage is a bandgap voltage reference.

15. The apparatus as recited in claim 11 wherein the voltage on the common signal line is at a second voltage, absent a defect, and at a third voltage if there is a defect in the first sensor line.

16. The apparatus as recited in claim 15 wherein a value of the second voltage, absent a defect, is higher than the third voltage.

17. The apparatus as recited in claim 11 further comprising a voltage divider circuit supplying the reference voltage.

18. The apparatus as recited in claim 11 wherein the first voltage is ground.

19. The apparatus as recited in claim 11 wherein the other sensor lines of the plurality of sensor lines includes transmit lines and receive lines of a touch sensor.

* * * * *